US012136607B2

(12) United States Patent
Kawai et al.

(10) Patent No.: US 12,136,607 B2
(45) Date of Patent: Nov. 5, 2024

(54) SEMICONDUCTOR DEVICES INCLUDING STACKED DIES WITH INTERLEAVED WIRE BONDS AND ASSOCIATED SYSTEMS AND METHODS

(71) Applicant: Micron Technology, Inc., Boise, ID (US)

(72) Inventors: Koichi Kawai, Yokohama (JP); Raj K. Bansal, Boise, ID (US); Takehiro Hasegawa, Yokohama (JP); Chang H. Siau, Saratoga, CA (US)

(73) Assignee: Micron Technology, Inc., Boise, ID (US)

( * ) Notice: Subject to any disclaimer, the term of this patent is extended or adjusted under 35 U.S.C. 154(b) by 302 days.

(21) Appl. No.: 17/718,217

(22) Filed: Apr. 11, 2022

(65) Prior Publication Data

US 2023/0061258 A1  Mar. 2, 2023

Related U.S. Application Data

(60) Provisional application No. 63/239,457, filed on Sep. 1, 2021.

(51) Int. Cl.
*H01L 25/065* (2023.01)
*H01L 23/00* (2006.01)
(Continued)

(52) U.S. Cl.
CPC .......... *H01L 25/0657* (2013.01); *H01L 24/47* (2013.01); *H01L 25/50* (2013.01);
(Continued)

(58) Field of Classification Search
CPC ..... H01L 25/0657; H01L 25/50; H01L 24/47; H01L 2224/48227; H01L 2224/49107;
(Continued)

(56) References Cited

U.S. PATENT DOCUMENTS

| 2011/0037158 A1* | 2/2011 | Youn ........................ H01L 24/33 257/692 |
| 2012/0056335 A1* | 3/2012 | Gillingham ............. H01L 24/92 257/777 |

(Continued)

FOREIGN PATENT DOCUMENTS

| TW | 201205577 A | 2/2012 |
| TW | 202129876 A | 8/2021 |

*Primary Examiner* — Timor Karimy
(74) *Attorney, Agent, or Firm* — Perkins Coie LLP (57) ABSTRACT

Memory devices and associated methods and systems are disclosed herein. A representative memory device includes a substrate and a memory controller electrically coupled to the substrate. The memory controller can include a first in/out (I/O) channel and a second I/O channel. The memory device can further include a plurality of first memories and second memories coupled to the substrate and arranged in a stack in which the first memories are interleaved between the second memories. The memory device can further include (i) a plurality of first wire bonds electrically coupling the first memories to the first I/O channel of the memory controller and (ii) a plurality of second wire bonds electrically coupling the second memories to the second I/O channel.

17 Claims, 6 Drawing Sheets

(51) Int. Cl.
*H01L 25/00* (2006.01)
*H10B 41/41* (2023.01)

(52) U.S. Cl.
CPC ............... *H01L 2224/48227* (2013.01); *H01L 2224/49107* (2013.01); *H01L 2224/4911* (2013.01); *H01L 2224/49174* (2013.01); *H10B 41/41* (2023.02)

(58) Field of Classification Search
CPC .. H01L 2224/4911; H10B 80/00; H10B 41/41
See application file for complete search history.

(56) References Cited

U.S. PATENT DOCUMENTS

2019/0088636 A1    3/2019  Gamini
2022/0208744 A1*  6/2022  Ng ........................ H01L 25/16

* cited by examiner

SEMICONDUCTOR DEVICES INCLUDING STACKED DIES WITH INTERLEAVED WIRE BONDS AND ASSOCIATED SYSTEMS AND METHODS

CROSS-REFERENCE TO RELATED APPLICATION(S)

The present application claims priority to U.S. Provisional Patent Application No. 63/239,457, filed Sep. 1, 2021, the disclosure of which is incorporated herein by reference in its entirety.

TECHNICAL FIELD

The present disclosure generally relates to semiconductor devices, such as memory devices, including stacked semiconductor dies electrically coupled to a substrate via interleaved wire bonds.

BACKGROUND

Memory packages or modules typically include multiple memory devices mounted on a substrate. Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Improving memory packages, generally, may include increasing memory cell density, increasing read/write speeds or otherwise reducing operational latency, increasing reliability, increasing data retention, reducing power consumption, reducing manufacturing costs, and reducing the size or footprint of the memory packages and/or components of the memory devices, among other metrics.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Embodiments of the present technology are directed to semiconductor devices, such as memory devices, and associated systems and methods. In several of the embodiments described below, a memory device includes a substrate and a memory controller electrically coupled to the substrate. The memory controller can include a first in/out (I/O) channel and a second I/O channel. The memory device can further include a plurality of first memories and second memories coupled to the substrate and arranged in a stack in which the first memories are interleaved between the second memories. The memory device can further include (i) a plurality of first wire bonds electrically coupling the first memories to the first I/O channel of the memory controller via the substrate, and (ii) a plurality of second wire bonds electrically coupling the second memories to the second I/O channel via the substrate.

In some embodiments the memories are NAND flash memories, and the first and second I/O channels are open NAND flash interface (ONFI) I/O channels. In some embodiments, the memory device can include additional memories of another type—such as dynamic random access (DRAM) memories—coupled to the substrate and electrically coupled to the memory controller. In some embodiments, the stack of first and second memories can be positioned on the memories of the other type, and the controller can be positioned below the memories of the other type.

In some aspects of the present technology, the interleaved/alternating connection of the I/O channels to the memories in the stack can help ensure that the electrical signals transmitted over the I/O channels to the memories have a substantially or generally similar strength, signal integrity, and/or other characteristic. For example, a total/combined length of the first wire bonds can be generally similar to, identical to, substantially similar to, and/or within a threshold tolerance of a total/combined length of the second wire bonds. Accordingly, the length of the first and second wire bonds can be balanced between the I/O channels such that a voltage drop, resistance, and/or other characteristic of the wire bonds is substantially similar for both of the first and second I/O channels of the memory controller. In some embodiments, the total/combined length of the of the first wire bonds can be within about 50%, within about 40%, within about 30%, within about 20%, and/or within about 10% or less of the total/combined length of the second wire bonds.

Numerous specific details are discussed to provide a thorough and enabling description of embodiments of the present technology. A person skilled in the art, however, will understand that the technology may have additional embodiments and that the technology may be practiced without several of the details of the embodiments described below with reference to FIGS. 1A-3. In other instances, well-known structures or operations often associated with memory devices are not shown, or are not described in detail, to avoid obscuring other aspects of the technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1A:
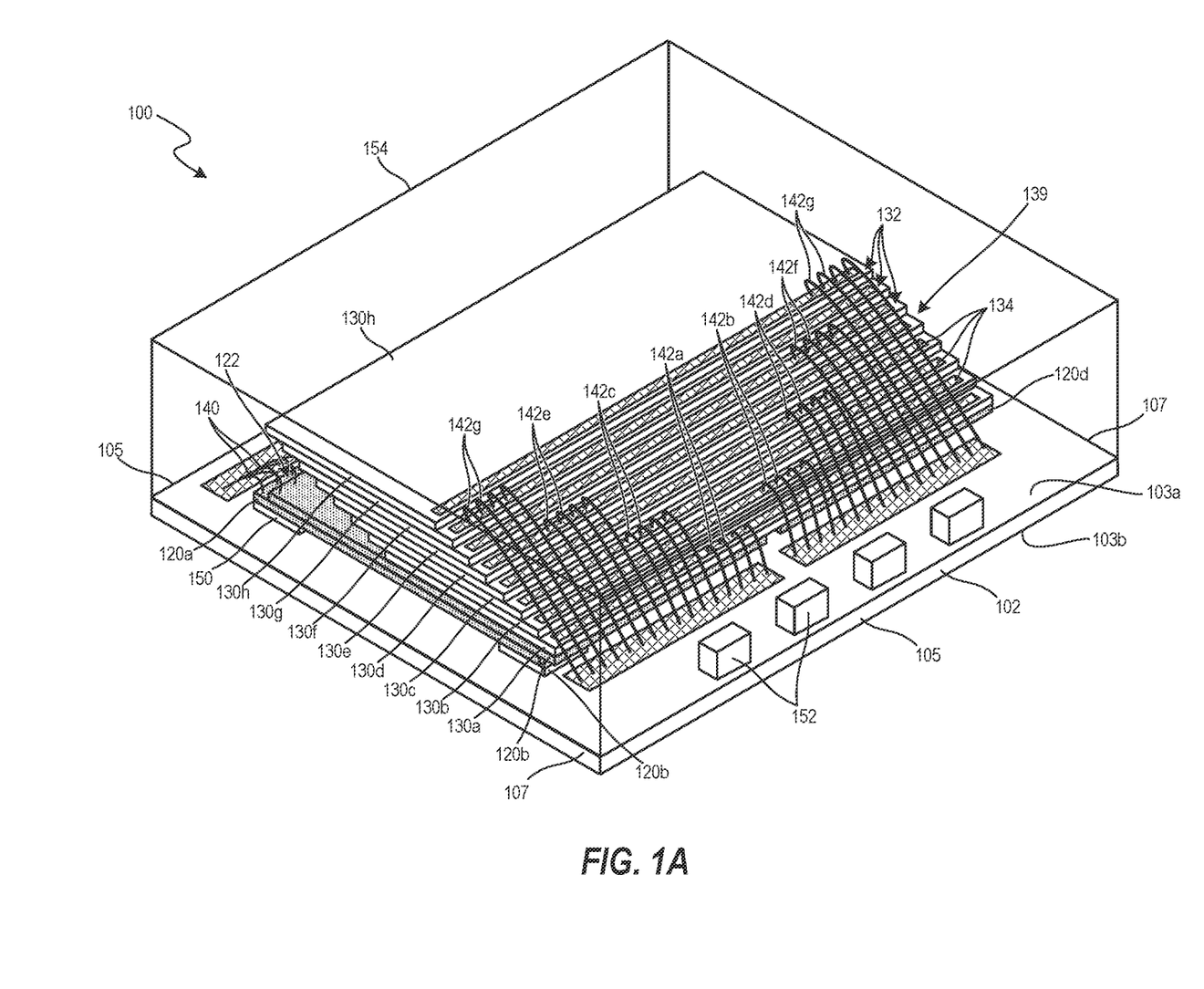
FIGS. 1A-1C are an isometric view, a top view, and a side view, respectively, of a memory device in accordance with embodiments of the present technology.
Figure 1B:
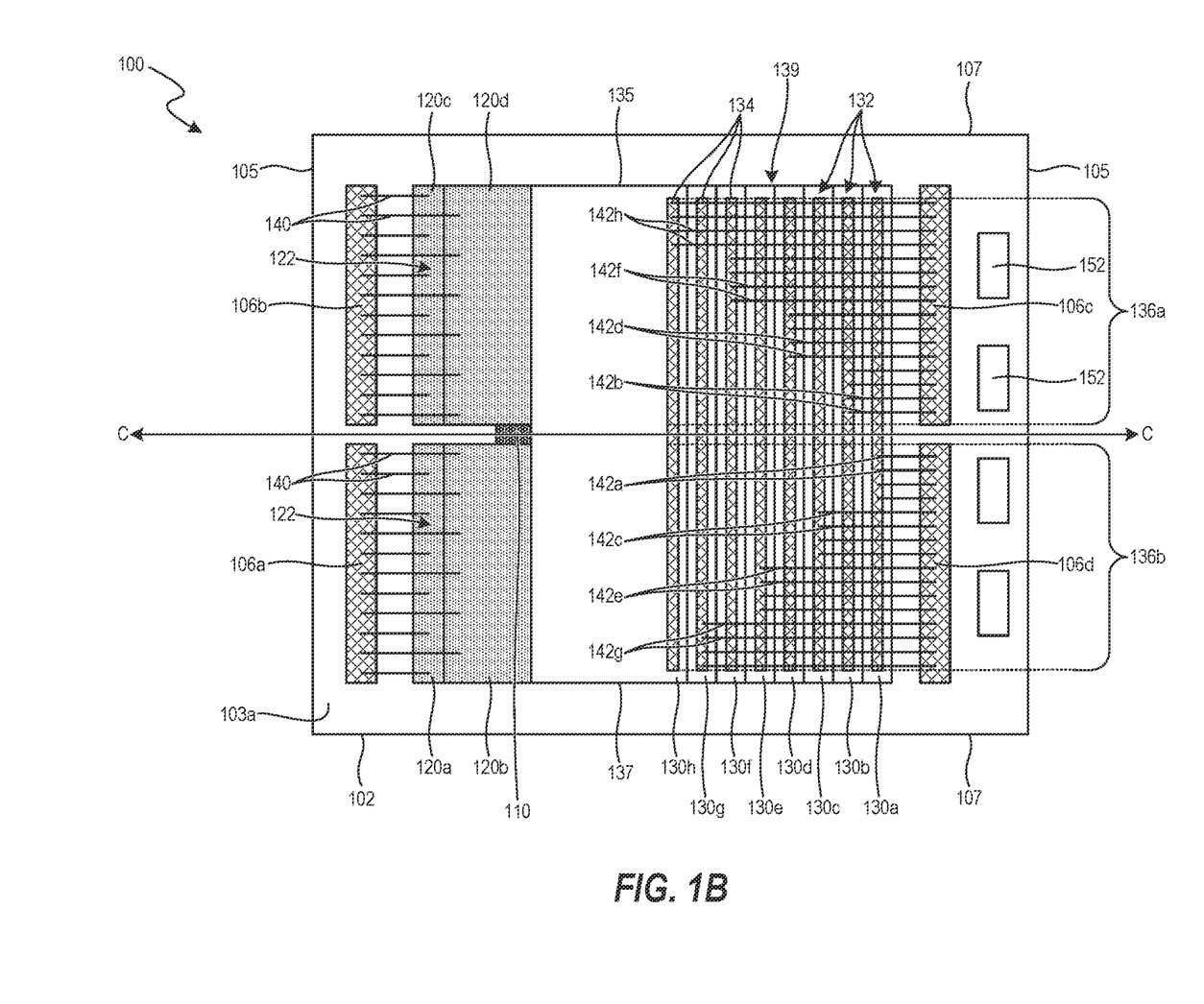
Figure 1C:
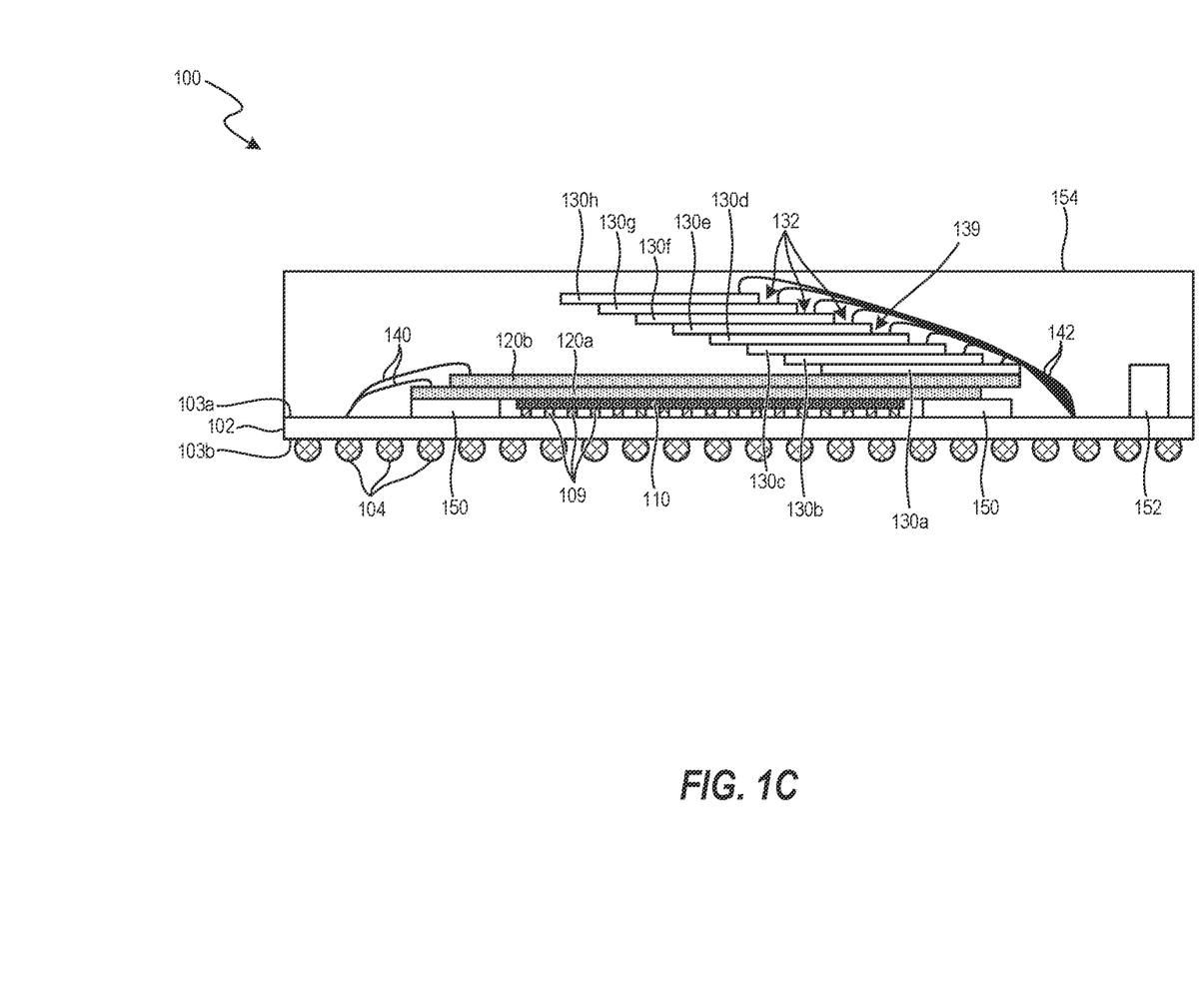

FIGS. 1A-1C are an isometric view, a top view, and a side view, respectively, of a memory device 100 in accordance with embodiments of the present technology. Referring to FIGS. 1A-1C together, the memory device 100 can include a substrate 102 having a first side 103a (e.g., an upper side) and a second side 103b (e.g., a lower side). In the illustrated embodiment, the substrate 102 carries (i) a controller 110 (obscured in FIG. 1A), (ii) a plurality of memories 120 of a first type (identified individually as first through fourth memories 120a-120d, respectively), and (iii) a plurality of memories 130 of a second type (identified individually as of first through eighth memories 130a-130h, respectively). The controller 110 can be electrically coupled (e.g., flip-chip bonded) to the substrate 102 via electrical connectors 109 (obscured in FIGS. 1A and 1B), such as solders balls, thermo-compression bonds, and/or the like. The memories 120 can be electrically coupled to the substrate 102 via corresponding ones of a plurality of wire bonds 140 (e.g., first wire bonds), and the memories 130 can be electrically coupled to the substrate 102 via corresponding ones of a plurality of wire bonds 142 (e.g., second wire bonds; identified individually as first through eight wire bonds 142a-h, respectively, as shown in FIGS. 1A and 1B). The substrate 102 electrically couples the controller 110 to the memories 120, 130 such that, for example, during operation of the memory device 100, the controller 110 can send data signals (e.g., read/write data signals) to and receive data signals from the memories 120, 130 during memory access operations.

The substrate 102 can be a printed circuit board (PCB), an interposer, a dielectric spacer, a semiconductor die (e.g., a logic die), and/or the like. In some embodiments, the substrate 102 can have a generally rectilinear (e.g., rectangular, square) shape including opposing first edges 105 and opposing second edges 107. The second side 103b of the substrate 102 can be connected to electrical connectors 104 (e.g., solder balls; obscured in FIGS. 1A and 1B) configured to electrically couple the memory device 100 to external circuitry (not shown). In the illustrated embodiment, the substrate 102 includes a plurality of electrical connection regions 106 (obscured in FIG. 1C; including individually identified first through fourth electrical connection regions 106a-106d). The substrate 102 can further include an electrical connection region positioned beneath the controller 110 and obscured in FIGS. 1A-1C. The electrical connection regions 106 can include multiple discrete bond pads, electrical connectors, and/or the like that facilitate connection to the individual wire bonds 140, the wire bonds 142, and/or the electrical connectors 109. The substrate 102 can further include electrical lines, traces, and/or the like extending therethrough and/or thereacross that electrically connect the electrical connection regions 106 to thereby electrically connect the memories 120, 130 to the controller 110.

In the illustrated embodiment, the memory device 100 includes a plurality of spacers 150 (obscured in FIG. 1B) positioned between the substrate 102 and the first and third memories 120a, c. For example, in some embodiments each of the spacers 150 can be positioned at and/or proximate to a respective corner of the (e.g., lower) first and third memories 120a, c (e.g., such that the memory device 100 includes eight of the spacers 150) to support the first and third memories 120a, c above the substrate 102. The spacers 150 can comprise blank silicon dies, passive or active electrical components, glass, functional semiconductor dies, and/or the like.

In some embodiments, the memories 120 can each have the same shape (e.g., rectangular, rectilinear, polygonal, circular, etc.) and dimensions. In the illustrated embodiment, the second memory 120b is coupled to (e.g., stacked over) the first memory 120a such that a lower surface of the second memory 120b is over (e.g., directly above, facing, and/or adjacent to) an upper surface of the first memory 120a. Likewise, the fourth memory 120d can be coupled to (e.g., stacked over) the third memory 120c such that a lower surface of the fourth memory 120d is over an upper surface of the third memory 120c. In the illustrated embodiment, the second memory 120b is laterally offset from the first memory 120a in a direction extending between the first edges 105 of the substrate 102, and the fourth memory 120d is laterally offset from the third memory 120c in the direction extending between the first edges 105 such that the first and third memories 120a, c each include an open portion 122 (e.g., a porch) exposed from beneath the second and fourth memories 120b, d, respectively. In other embodiments, the memories 120 can be arranged differently, can have different shapes and/or dimensions, and so on.

The memories 120 can include electrical contacts (not shown) exposed at the upper surfaces thereof (e.g., at the open portions 122 of the first and third memories 120a, c). The wire bonds 140 can extend between and electrically connect the electrical contacts of the memories 120 to one or more of the electrical connection regions 106 of the substrate 102. For example, in the illustrated embodiment the wire bonds 140 electrically connect (i) the first and second memories 120a, b to the first electrical connection region 106a and (ii) the third and fourth memories 120c, d to the second electrical connection region 106b. In other embodiments, the memories 120 can be electrically coupled to the substrate 102 in different manners (e.g., via flip-chip bonding).

In some embodiments, the memories 130 can each have the same shape (e.g., rectangular, rectilinear, polygonal, circular, etc.) and dimensions. In the illustrated embodiment, the memories 130 are arranged in a stack 139 with (i) the first memory 130a positioned on and coupled to the first and third memories 120a, c (e.g., to portions of the upper surfaces thereof), (ii) the eighth memory 130h positioned at the top of the stack, and (iii) the second through seventh memories 130b-g are positioned between the first and eighth memories 130a, h. In some embodiments, each of the memories 130 can be laterally offset from one another (e.g., in the direction extending between the first edges 105 of the substrate 102) such that, each of the memories 130 includes an open portion 132 (e.g., a porch) exposed from the stack 139. In the illustrated embodiment, for example, the second memory 130b is laterally offset from the lowermost first memory 130a, the third memory 130c is laterally offset from the lower second memory 130b, the fourth memory 130d is laterally offset from the lower third memory 130c, and so on. In other embodiments, the memories 120 can be arranged/stacked differently, can have different shapes and/or dimensions, and so on.

In the illustrated embodiment, the memories 130 each include an electrical connection region 134 positioned at the open portion 132 thereof. The electrical connection regions 134 can each include a plurality of discrete bond pads or other electrical connectors configured to be electrically coupled to corresponding ones of the wire bonds 142. The wire bonds 142 electrically couple the electrical connection regions 134 of the memories 130 to corresponding ones of the electrical connection regions 106 of the substrate 102. In the illustrated embodiment, for example, the first wire bonds 142a, the third wire bonds 142c, the fifth wire bonds 142e, and the seventh wire bonds 142g electrically connect the electrical connection regions 134 of the first memory 130a, the third memory 130c, the fifth memory 130e, and the seventh memory 130g, respectively, to the fourth electrical connection region 106d of the substrate 102. Likewise, the second wire bonds 142b, the fourth wire bonds 142d, the sixth wire bonds 142f, and the eighth wire bonds 142h electrically connect the electrical connection regions 134 of the second memory 130b, the fourth memory 130d, the sixth memory 130f, and the eighth memory 130h, respectively, to the third electrical connection region 106c of the substrate 102. Accordingly, the memories 130 can be electrically connected to the third and fourth electrical connection regions 106c, d of the substrate 102 in an alternating/interleaved manner based on their position (e.g., vertical position) in the stack 139. In some embodiments, the alternating memories 130a, c, e, g can be referred to as first memories and the other alternating memories 130b, d, f, h can be referred to as second memories. Likewise, the alternating wire bonds 142a, c, e, g can be referred to as first wire bonds and the other alternating wire bonds 142b, d, f, h can be referred to as second wire bonds. In other embodiments, the memory device 100 can include more or fewer of the memories 130 in the stack 139 and/or the wire bonds 142.

In general, the memories 120, 130 can include one or more (e.g., multiple stacked) semiconductor dies each including integrated memory circuitry and/or logic circuitry, which can include various types of semiconductor components and functional features, such as dynamic random-access memory (DRAM), static random-access memory (SRAM), flash memory (e.g., NAND and/or NOR), other forms of integrated circuit memory, processing circuits, and/or other semiconductor features. In some embodiments, the memories 120 of the first type and the memories 130 of the second type can be different types of memories. For example, the memories 120 of the first type can be DRAM memories (e.g., DRAM memory dies, DRAM memory chips, DRAM memory packages, or the like). In some embodiments, the memories 130 of the second type can be NAND memories (e.g., NAND memory dies, NAND memory chips, NAND memory packages, or the like). The memories 120 of the first type can be identical (e.g., DRAM memory packages manufactured to have the same design and specifications) and the memories 130 of the second type can be identical (e.g., NAND memory packages manufactured to have the same design and specifications). In other embodiments, the memories 120 and/or the memories 130 can be different from one another (e.g., including different types of memory dies or different combinations of controller, logic, and/or memory dies).

As best seen in FIG. 1C, the controller 110 can be coupled to the substrate 102 below the memories 120 (e.g., in a space formed below the first and third memories 120a, c between the spacers 150). As described in detail below with reference to FIG. 1D, the controller 110 can include circuitry configured to read and write to the memories 120 and/or the memories 130.

In some embodiments, the memory device 100 can further include additional passive or active electrical components supported by and/or electrically coupled to the substrate 102, such as electrical components 152. In some embodiments, the electrical components 152 are capacitors. In some embodiments, the memory device 100 can include a molded material 154 over the first side 103a of the substrate 102 (the molded material 154 is not shown in FIG. 1B for ease of illustration). The molded material 154 can at least partially surround the controller 110, the memories 120, the memo-ries 130, the wire bonds 140, the wire bonds 142, the spacers 150, the electrical components 152, and/or additional components of the memory device 100 to protect one or more of these components from contaminants and/or physical damage. For example, in the illustrated embodiment the molded material 154 encapsulates (e.g., seals) the components of the memory device 100 coupled to the first side 103a of the substrate 102.

Figure 1D:
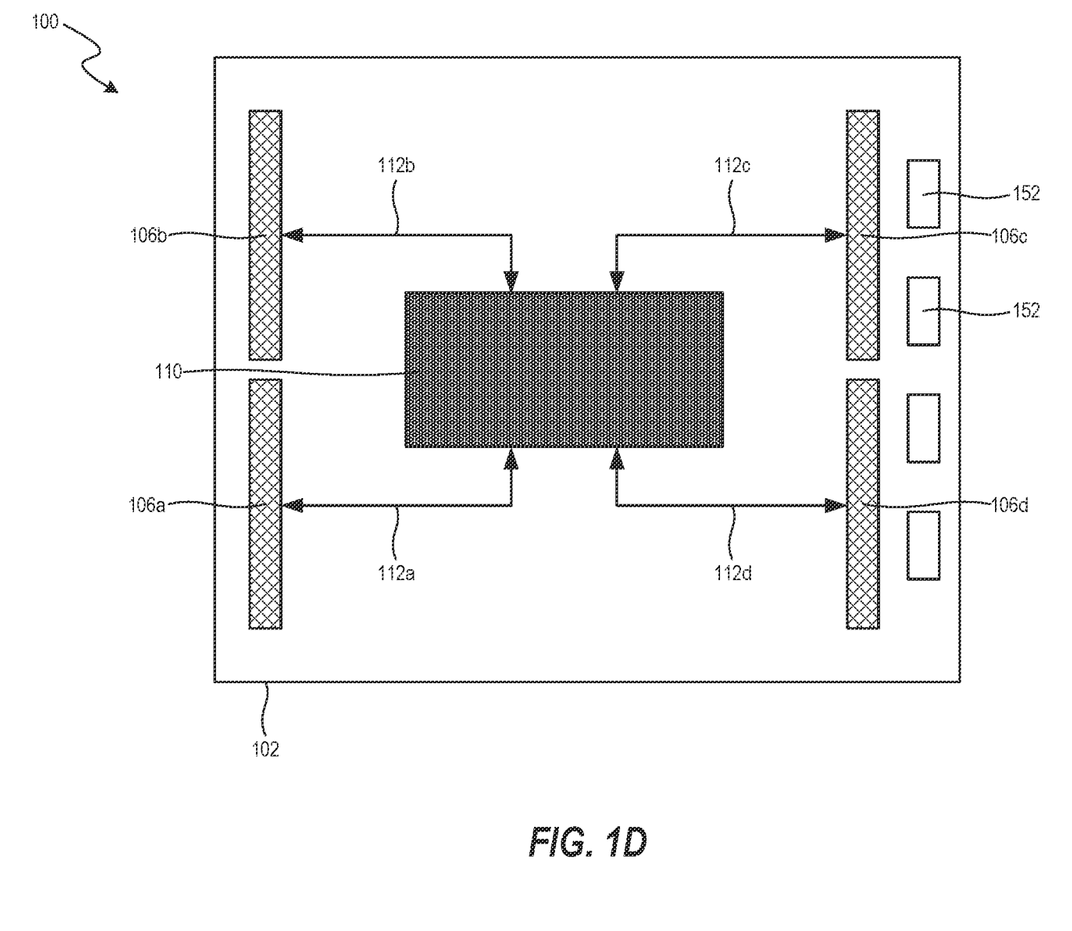
FIG. 1D is a partially-schematic top view of the memory device of FIGS. 1A-1C in accordance with embodiments of the present technology.

FIG. 1D is a partially-schematic top view of the memory device 100 with the memories 120, the memories 130, the spacers 150, and the molded material 154 omitted for clarity in accordance with embodiments of the present technology. In the illustrated embodiment, the controller 110 includes a plurality of in/out (I/O) channels 112 (identified individually as first through fourth I/O channels 112a-112d). The first through fourth I/O channels 112a-d can be electrically coupled to the electrical connection regions 106a-d, respectively, of the substrate 102. In some embodiments, the third and fourth I/O channels 112c, d electrically coupled to the memories 130 can be configured in accordance with the open NAND flash interface (ONFI) standard.

With reference to FIGS. 1A-1D together, each of the I/O channels 112 can comprise a separate dedicated communication path from the controller 110 that can be used to communicate (e.g., process I/O commands) simultaneously with individual ones or groups of the memories 120, 130 via the substrate and the wire bonds 140, 142. For example, the controller 110 can communicate with (i) the first and second memories 120a, b via the first I/O channel 112a, (ii) the third and fourth memories 120c, d via the second I/O channel 112b, (iii) the second, fourth, sixth, and eighth memories 130b, d, f, h via the third I/O channel 112c, and (iv) the first, third, fifth, and seventh memories 130a, c, e, g via the fourth I/O channel 112d. In some embodiments, the controller 110 can include more or fewer of the channels 112. For example, the first and second I/O channels 112a, b can comprise a single integrated communication channel, and/or the controller 110 can include additional ones of the channels 112 coupled to the memories 130.

Accordingly, with continued reference to FIGS. 1A-1D together, the third and fourth I/O channels 112c, d of the controller 110 can be electrically coupled to alternating/interleaved ones of the memories 130 in the stack 139 via the third and fourth electrical connection regions 106c, d of the substrate 102. For example, in the illustrated embodiment the alternating/interleaved second, fourth, sixth, and eighth memories 130b, d, f, h are electrically coupled to the third I/O channel 112c of the controller 110 via the electrical coupling of the wire bonds 142 to the third electrical connection region 106c, and the alternating/interleaved first, third, fifth, and seventh memories 130a, c, e, g are electrically coupled to the fourth I/O channel 112d of the controller 110 via the electrical coupling of the wire bonds 142 to the fourth electrical connection region 106d.

In some aspects of the present technology, the interleaved/alternating connection of the third and fourth channels 112c, d to the memories 130 in the stack 139 can help ensure that the electrical signals transmitted over the channels 112 to the memories 130 can have a substantially or generally similar strength, signal integrity, and/or other characteristic. For example, a total/combined length of the wire bonds 142b, d, f, h electrically coupling the memories 130b, d, f, h, respectively, to the third electrical connection region 106c can be generally similar to, identical to, substantially similar to, and/or within a threshold tolerance of a total/combined length of the wire bonds 142a, c, e, g electrically coupling the memories 130a, c, e, g, respectively, to the fourth electrical connection region 106d. That is, for example, the length of the wire bonds 142—determined by the position of the memories 130 in the stack—can be balanced between the channels 112 such that a voltage drop, resistance, and/or other characteristic of the wire bonds 142 is substantially similar for the third and fourth channels 112c, d. In some embodiments, the total/combined length of the of the wire bonds 142a, c, e, g can be within about 50%, within about 40%, within about 30%, within about 20%, and/or within about 10% or less of the total/combined length of the wire bonds 142b, d, f, h.

Referring to FIG. 1B, in the illustrated embodiment the memories 130 can each include a first side 135 and an opposing second side 137, and the electrical connection regions 134 of the memories 130 can extend from adjacent the first side 135 to adjacent the second side 137 (e.g., substantially between the first and second sides 135, 137). The third electrical connection region 106c of the substrate 102 can be positioned beneath/adjacent a first portion 136a of the electrical connection regions 134 proximate the first sides 135 of the memories 130, and the fourth electrical connection region 106d can be positioned beneath/adjacent to a second portion 136b of the electrical connection regions 134 proximate the second sides 137 of the memories 130. Accordingly, the wire bonds 142b, d, f, h can be electrically coupled to the first portion 136a of the electrical connection regions 134 while the wire bonds 142a, c, e, g can be electrically coupled to the second portion 136b of the electrical connection regions 134 of the memories 130.

Further, in the illustrated embodiment the memory device 100 (e.g., the stack 139) includes a centerline C (FIG. 1B). The first and fourth electrical connection regions 106a, d of the substrate 102 and the first and second memories 120a, b can be positioned on one side of the centerline C adjacent one of the second edges 107, and the second and third electrical connection regions 106b, c and the second and third memories 120c, d can be positioned on the other side of the centerline C adjacent the other one of the second edges 107. Accordingly, the wire bonds 142a, c, e, g can correspondingly extend on one side of the centerline C while the wirebonds 142b, d, f, h extend on the other side of the centerline C.

Referring again to FIGS. 1A-1D together, in some embodiments the first and second portions 134a, b of the electrical connection regions 134 are configured to be separately addressable by the controller 110 such that the memories 130 can be identically manufactured and arranged in the stack 139 before being coupled to either the third electrical connection region 106c or the fourth electrical connection region 106d of the substrate 102. That is, for example, all or substantially all of the electrical connection regions 134 can include functional electrical connections (e.g., bond pads), and/or the first and second portions 136a, b of the electrical connection regions 134 can provide redundant connections for the memories 130. In other embodiments, either the first portion 136a or the second portion 136b of the electrical connection regions 134 can be non-functional (e.g., including "dummy" connections). For example, the first portions 136a of the electrical connection regions 134 of the memories 130a, c, e, g coupled to the fourth electrical connection region 106d can be non-functional (e.g., including "dummy" bond pads), while the second portions 136b of the electrical connection regions 134 of the memories 130b, d, f, h can be non-functional.

Figure 2:
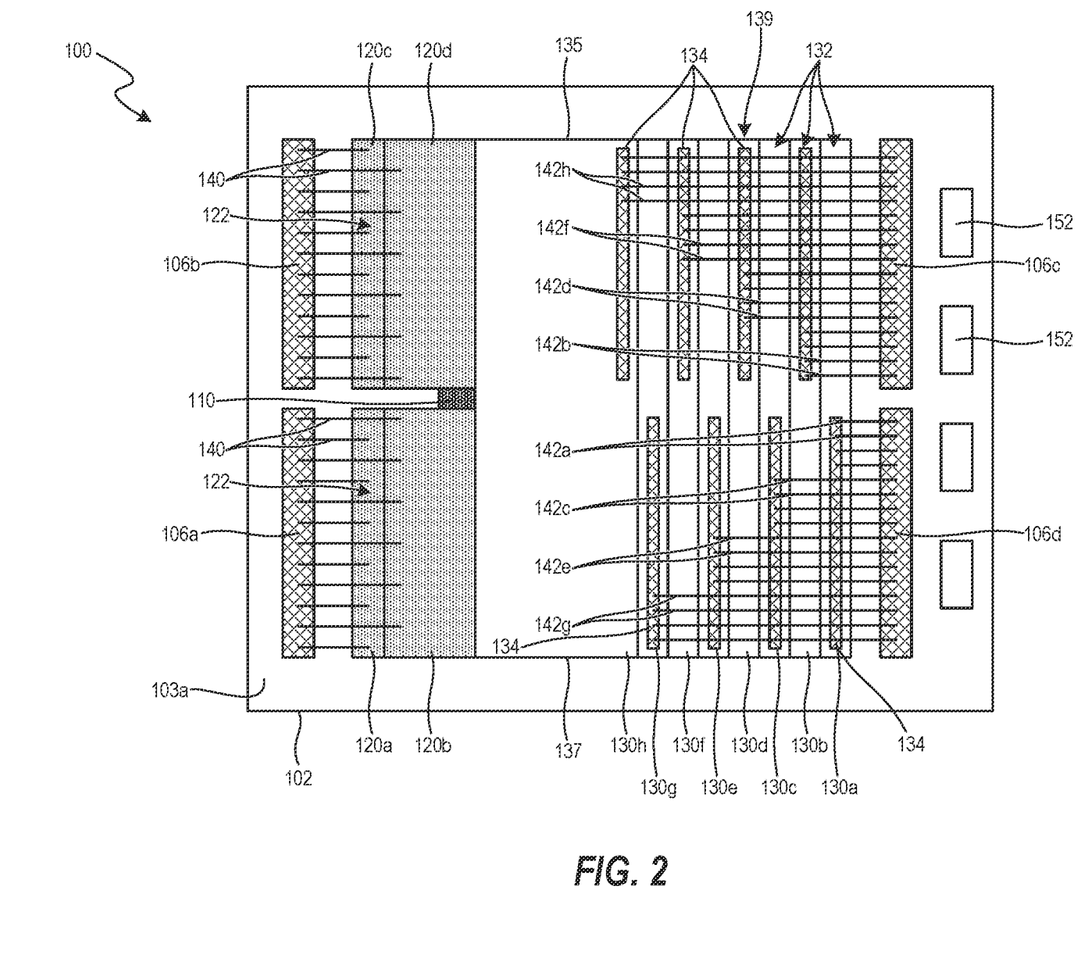
FIG. 2 is a top view of the memory device of FIGS. 1A-1D in accordance with additional embodiments of the present technology.

In other embodiments, the electrical connection regions 134 need not span substantially between the first and second sides 135, 137 of the memories 130 and can instead be positioned only to facilitate connection to the respective ones of the electrical connection regions 106 of the substrate 102. FIG. 2, for example, is a top view of the memory device 100 in accordance with additional embodiments of the present technology. In the illustrated embodiment, the electrical connection regions 134 of the memories 130b, d, f, h extend only partially from the first sides 135 of the memories 130 toward the second sides 137 such that they are positioned adjacent (e.g., in-line with) the third electrical connection region 106c of the substrate 102. That is, the first electrical connection regions 134 of the memories 130b, d, f, h can be positioned on one side of the centerline C (FIG. 1B). Likewise, the electrical connection regions 134 of the memories 130a, c, e, g extend only partially from the second sides 137 of the memories 130 toward the first sides 135 such that they are positioned adjacent (e.g., in-line with) the fourth electrical connection region 106d of the substrate 102 on the other side of the centerline C. That is, individual ones of the electrical connection regions 134 of interleaved ones of the memories 130 in the stack 139 can be positioned adjacent the first side 135 or the second side 137 of the memory 130 to provide a "right side" or "left side" electrical connection.

Figure 3:
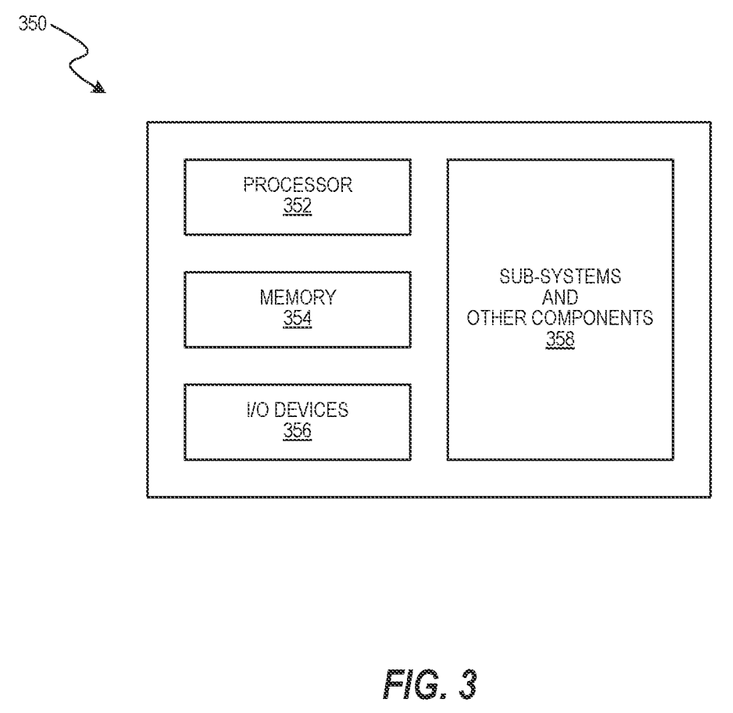
FIG. 3 is a schematic view of a system that includes a memory device in accordance with embodiments of the present technology.

The memory device 100 described in detail above with reference to FIGS. 1A-2 and/or packages incorporating the memory device 100 can be incorporated into any of a myriad of larger and/or more complex systems, a representative example of which is system 350 shown schematically in FIG. 3. The system 350 can include a processor 352, a memory 354 (e.g., SRAM, DRAM, NAND, flash, and/or other memory devices), input/output devices 356, and/or other subsystems or components 358. The memory devices and/or packages described above with reference to FIGS. 1A-2 can be included in any of the elements shown in FIG. 3. The resulting system 350 can be configured to perform any of a wide variety of suitable computing, processing, storage, sensing, imaging, and/or other functions. Accordingly, representative examples of the system 350 include, without limitation, computers and/or other data processors, such as desktop computers, laptop computers, Internet appliances, hand-held devices (e.g., palm-top computers, wearable computers, cellular or mobile phones, personal digital assistants, music players, and so on), tablets, multi-processor systems, processor-based or programmable consumer electronics, network computers, and minicomputers. Additional representative examples of the system 350 include lights, cameras, vehicles, etc. With regard to these and other example, the system 350 can be housed in a single unit or distributed over multiple interconnected units, for example, through a communication network. The components of the system 350 can accordingly include local and/or remote memory storage devices and any of a wide variety of suitable computer-readable media.

The following examples are illustrative of several embodiments of the present technology:

1. A memory device, comprising:
   a substrate;
   a memory controller electrically coupled to the substrate, wherein the memory controller includes a first in/out (I/O) channel and a second I/O channel;
   a plurality of first memories and second memories arranged in a stack, wherein the first memories are interleaved between the second memories in the stack;
   a plurality of first wire bonds electrically coupling the first memories to the first I/O channel of the memory controller via the substrate; and a plurality of second wire bonds electrically coupling the second memories to the second I/O channel of the memory controller via the substrate.

2. The memory device of example 1 wherein the first and second memories are identical.

3. The memory device of example 1 or example 2 wherein the first and second memories are NAND flash memories.

4. The memory device of any one of examples 1-3 wherein the first and second I/O channels are open NAND flash interface (ONFI) I/O channels.

5. The memory device of any one of examples 1-4 wherein a combined length of the first wire bonds is within about 30% of a combined length of the second wire bonds.

6. The memory device of any one of examples 1-5 wherein a combined length of the first wire bonds is within about 20% of a combined length of the second wire bonds.

7. The memory device of any one of examples 1-6 wherein the first memories and the second memories each include circuitry and an electrical connection region electrically coupled to a corresponding one or more of the first wire bonds or the second wire bonds, wherein the electrical connection region includes first bond pads electrically coupled to the corresponding one or more of the first wire bonds or the second wire bonds and second bond pads not electrically coupled to the first wire bonds, and wherein the first and second bond pads are identically coupled to the circuitry.

8. The memory device of any one of examples 1-6 wherein the stack includes a centerline, wherein the first memories and the second memories each include an electrical connection region electrically coupled to the first wire bonds or the second wire bonds, wherein the electrical connection region of each of the first memories is positioned on a first side of the centerline, and wherein the electrical connection region of each of the second memories is positioned on a second side of the centerline opposite the first side.

9. The memory device of any one of examples 1-8 wherein the first memories and the second memories each include an electrical connection region having a first portion and a second portion, wherein the first and second portions are separately addressable by the memory controller, wherein the first portions of the electrical connection regions of the first memories are electrically coupled to corresponding ones of the first wire bonds, and wherein the second portions of the electrical connection regions of the second memories are electrically coupled to corresponding ones of the second wire bonds.

10. A memory device, comprising:
a substrate;
a memory controller electrically coupled to the substrate, wherein the memory controller includes a first in/out (I/O) channel and a second I/O channel;
a plurality of first memories of a first type coupled to the substrate;
a plurality of second memories of a second type coupled to one or more of the first memories and arranged in a stack; and
a plurality of wire bonds electrically coupling the second memories to the memory controller via the substrate, wherein alternating ones of the second memories are electrically coupled to the first I/O channel or the second I/O channel of the memory controller.

11. The memory device of example 10 wherein the first type is different than the second type.

12. The memory device of example 10 or example 11 wherein the first memories are dynamic random access (DRAM) memories, and wherein the second memories are NAND flash memories.

13. The memory device of example 12 wherein the first and second I/O channels are open NAND flash interface (ONFI) I/O channels.

14. The memory device of any one of examples 10-13 wherein the memory controller is positioned beneath the first memories.

15. The memory device of any one of examples 10-15 wherein the first memories are electrically coupled to the memory controller.

16. The memory device of example 14 wherein the memory controller includes a third I/O channel, and wherein the first memories are electrically coupled to the third I/O channel.

17. The memory device of any one of examples 10-16 wherein the second memories in the stack are laterally offset from one another.

18. A method of manufacturing a memory device, the method comprising:
electrically coupling a memory controller to a substrate;
arranging a plurality of memories in a stack over the substrate;
forming first wire bonds electrically coupling alternating ones of the memories to a first in/out (I/O) channel of the memory controller; and
forming second wire bonds electrically coupling the other alternating ones of the memories to the second I/O channel of the memory controller.

19. The method of example 18 wherein the memories are NAND flash memories.

20. The method of example 18 or example 19 wherein the method further comprises laterally offsetting each of the memories in the stack.

The above detailed description of embodiments of the present technology are not intended to be exhaustive or to limit the technology to the precise forms disclosed above. Although specific embodiments of, and examples for, the technology are described above for illustrative purposes, various equivalent modifications are possible within the scope of the technology as those skilled in the relevant art will recognize. For example, although steps are presented in a given order, other embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively.

As used herein, the phrase "and/or" as in "A and/or B" refers to A alone, B alone, and A and B. To the extent any materials incorporated herein by reference conflict with the present disclosure, the present disclosure controls. Additionally, the term "comprising" is used throughout to mean including at least the recited feature(s) such that any greater number of the same feature and/or additional types of other features are not precluded. It will also be appreciated that specific embodiments have been described herein for purposes of illustration, but that various modifications may be made without deviating from the technology. Further, while advantages associated with some embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A memory device, comprising:
   a substrate;
   a memory controller electrically coupled to the substrate, wherein the memory controller includes a first in/out (I/O) channel and a second I/O channel;
   a plurality of first memories and second memories arranged in a stack, wherein the first memories are interleaved between the second memories in the stack;
   a plurality of first wire bonds electrically coupling the first memories to the first I/O channel of the memory controller via the substrate; and
   a plurality of second wire bonds electrically coupling the second memories to the second I/O channel of the memory controller via the substrate.

2. The memory device of claim 1 wherein the first and second memories are identical.

3. The memory device of claim 1 wherein the first and second memories are NAND flash memories.

4. The memory device of claim 1 wherein the first and second I/O channels are open NAND flash interface (ONFI) I/O channels.

5. The memory device of claim 1 wherein a combined length of the first wire bonds is within about 30% of a combined length of the second wire bonds.

6. The memory device of claim 1 wherein a combined length of the first wire bonds is within about 20% of a combined length of the second wire bonds.

7. The memory device of claim 1 wherein the first memories and the second memories each include circuitry and an electrical connection region electrically coupled to a corresponding one or more of the first wire bonds or the second wire bonds, wherein the electrical connection region includes first bond pads electrically coupled to the corresponding one or more of the first wire bonds or the second wire bonds and second bond pads not electrically coupled to the first wire bonds, and wherein the first and second bond pads are identically coupled to the circuitry.

8. The memory device of claim 1 wherein the stack includes a centerline, wherein the first memories and the second memories each include an electrical connection region electrically coupled to the first wire bonds or the second wire bonds, wherein the electrical connection region of each of the first memories is positioned on a first side of the centerline, and wherein the electrical connection region of each of the second memories is positioned on a second side of the centerline opposite the first side.

9. The memory device of claim 1 wherein the first memories and the second memories each include an electrical connection region having a first portion and a second portion, wherein the first and second portions are separately addressable by the memory controller, wherein the first portions of the electrical connection regions of the first memories are electrically coupled to corresponding ones of the first wire bonds, and wherein the second portions of the electrical connection regions of the second memories are electrically coupled to corresponding ones of the second wire bonds.

10. A memory device, comprising:
    a substrate;
    a memory controller electrically coupled to the substrate, wherein the memory controller includes a first in/out (I/O) channel and a second I/O channel;
    a plurality of first memories of a first type coupled to the substrate;
    a plurality of second memories of a second type coupled to one or more of the first memories and arranged in a stack; and
    a plurality of wire bonds electrically coupling the second memories to the memory controller via the substrate, wherein alternating ones of the second memories are electrically coupled to the first I/O channel or the second I/O channel of the memory controller.

11. The memory device of claim 10 wherein the first type is different than the second type.

12. The memory device of claim 10 wherein the first memories are dynamic random access (DRAM) memories, and wherein the second memories are NAND flash memories.

13. The memory device of claim 12 wherein the first and second I/O channels are open NAND flash interface (ONFI) I/O channels.

14. The memory device of claim 10 wherein the memory controller is positioned beneath the first memories.

15. The memory device of claim 14 wherein the memory controller includes a third I/O channel, and wherein the first memories are electrically coupled to the third I/O channel.

16. The memory device of claim 10 wherein the first memories are electrically coupled to the memory controller.

17. The memory device of claim 10 wherein the second memories in the stack are laterally offset from one another.

* * * * *